US007441222B2

(12) United States Patent
Mathews (10) Patent No.: US 7,441,222 B2
(45) Date of Patent: Oct. 21, 2008

(54) DIFFERENTIAL PAIR CONNECTION ARRANGEMENT, AND METHOD AND COMPUTER PROGRAM PRODUCT FOR MAKING SAME

(75) Inventor: Neel Mathews, Bangalore (IN)

(73) Assignee: Nokia Corporation, Espoo (FI)

( * ) Notice: Subject to any disclaimer, the term of this patent is extended or adjusted under 35 U.S.C. 154(b) by 201 days.

(21) Appl. No.: 11/540,082

(22) Filed: Sep. 29, 2006

(65) Prior Publication Data

US 2008/0082950 A1  Apr. 3, 2008

(51) Int. Cl.
*H03K 5/22* (2006.01)
(52) U.S. Cl. .......................................... 716/15; 327/65
(58) Field of Classification Search .................. 327/65, 327/229; 716/1–18; 257/758
See application file for complete search history.

(56) References Cited

U.S. PATENT DOCUMENTS

| 6,235,997 | B1 * | 5/2001 | Asada et al. ................. | 174/260 |
| 6,423,909 | B1 * | 7/2002 | Haynie et al. ................ | 174/261 |
| 7,180,011 | B1 * | 2/2007 | Hall et al. .................... | 174/520 |
| 2002/0056912 | A1 * | 5/2002 | Roth et al. ................... | 257/750 |
| 2005/0077977 | A1 * | 4/2005 | Beale et al. ..................... | 333/5 |
| 2006/0042828 | A1 * | 3/2006 | Matsuo ......................... | 174/255 |
| 2007/0207674 | A1 * | 9/2007 | Minich ......................... | 439/608 |

\* cited by examiner

*Primary Examiner*—Vuthe Siek
*Assistant Examiner*—Aric Lin
(74) *Attorney, Agent, or Firm*—Harrington & Smith, PC

(57) ABSTRACT

Disclosed is a connection arrangement for connecting end portions of differential pairs to pads. In the arrangement, first and second signal traces comprising the differential pair are formed in first and second layers, respectively, of a printed circuit board. Each of the signal traces has a run portion and an end portion. The end portions of the first and second signal traces are connected, respectively, to first and second pads. At the beginning of the end portions in a region of the printed circuit board on a first lateral side of the first pad both the first and second signal traces split into two branches. One branch each from the first and second signal traces traverses a path around a top side of the first pad and the remaining branches from the first and second signal traces traverse a path around the bottom side of the first pad. The branches of the first and second signal traces come together again in a region of the printed circuit board on a second lateral side of the first pad. A terminal portion of the first signal trace extends away from the region where the two branches of the first signal trace come together again and contacts the first pad. A terminal portion of the second signal trace extends away from the region where the two branches of the second signal trace come together again in a direction away from the first pad and towards the second pad, and contacts the second pad. A projection of the run and branch portions of the second signal trace in a plane of the first layer overlaps the run and branch portions of first signal trace up to the point where the branches come together again.

31 Claims, 10 Drawing Sheets

FIG. 1

PRIOR ART

FIG. 2

PRIOR ART

FIG. 3

PRIOR ART

DIFFERENTIAL PAIR CONNECTION ARRANGEMENT, AND METHOD AND COMPUTER PROGRAM PRODUCT FOR MAKING SAME

TECHNICAL FIELD

The invention generally concerns integrated circuit and printed circuit board design, and more specifically concerns differential signal line structures for use in integrated circuits and printed circuit boards.

BACKGROUND

Differential pairs are used in printed circuit boards and other applications to improve noise immunity of signal connections. In a differential pair, two signal traces are in close physical proximity, generally parallel to one another and having similar physical configurations. The signal carried by the differential pair is not referenced either to ground or high voltage level as in the case of a single-ended signal. Instead, the signal is referenced to the voltage difference between signals carried on the signal traces being above a given level. In such an arrangement, electrical noise coupled to the signal traces comprising the differential pair represents common-mode noise that may cancel when a signal on a first trace of the differential pair is subtracted from a signal on the second trace of the differential pair.

Routing of differential pairs in accordance with the prior art can result in impedance mismatches with resultant bandwidth limitations. Noise and bandwidth performance of the differential pairs becomes even more critical as signal frequencies increase. Accordingly arrangements and methods are sought that improve noise and bandwidth performance of differential pairs.

SUMMARY OF THE PREFERRED EMBODIMENTS

The foregoing and other problems are overcome, and other advantages are realized, in accordance with the following embodiments of the invention.

A first embodiment of the invention is a differential pair connection arrangement comprising first and second signal traces formed, respectively, in first and second layers of a substrate. The first and second signal traces each comprise run portions and end portions. The end portions of the first and second signal traces each split into two branches on a first lateral side of a first pad, a branch of each signal trace traversing a path around a top side of the first pad and a branch of each signal trace traversing a path around a bottom side of the first pad. The branches of the first and second signal traces come together again in terminal portions on a second lateral side of the first pad, the terminal portion of the first signal trace extending toward and contacting the first pad and the terminal portion of the second signal trace extending away from the first pad and contacting a second pad. A projection of the run portion and branches of the second signal trace in a plane of the first layer substantially overlaps the run portion and branches of the first signal trace up to the portions where the branches of the traces come together again to form the terminal portions of the signal traces.

A second embodiment of the invention is a printed circuit board comprising at least one integrated circuit and a differential pair connection arrangement. The integrated circuit has first and second ports, the first and second ports of the integrated circuit connected to first and second pads, respectively, of the printed circuit board. The differential pair connection arrangement is coupled to the first and second pads of the printed circuit board. The differential pair connection arrangement comprises a first signal trace formed in a first layer of the printed circuit board, the first signal trace comprising a run portion and an end portion. The end portion of the first signal trace splits into two branches on a first lateral side of the first pad in the first layer, the two branches traversing paths around top and bottom sides of the first pad, and coming together again in a terminal portion on a second lateral side of the first pad. The terminal portion of the first signal trace contacts the first pad. The differential pair connection arrangement further comprises a second signal trace formed in a second layer of the printed circuit board, the second signal trace comprising a run portion and an end portion. The end portion of the second signal trace splits into two branches on the first lateral side of the first pad, the two branches of the second signal trace traversing paths around the top and bottom sides of the first pad, and coming together again in a terminal portion on the second lateral side of the first pad. The terminal portion of the second signal trace extends in a direction away from the first pad and contacts the second pad. A projection of the run portion and branches of the second signal trace in a plane of the first layer substantially overlaps the run portion and branches of the first signal trace.

A third embodiment of the invention is an electronic device comprising at least one printed circuit board. The printed circuit board comprises at least one integrated circuit and a differential pair connection arrangement. The integrated circuit has first and second ports, the first and second ports of the integrated circuit connected to first and second pads, respectively, of the printed circuit board. The differential pair connection arrangement is coupled to the first and second pads of the printed circuit board. The differential pair connection arrangement comprises first and second signal traces formed in first and second layers of the printed circuit board, respectively, the first and second signal traces each comprising run portions and end portions. The end portions of the first and second signal traces each split into two branches on a first lateral side of the first pad, a branch of each signal trace traversing a path around a top side of the first pad and a branch of each signal trace traversing a path around a bottom side of the first pad. The branches of the first and second signal traces come together again in terminal portions on a second lateral side of the first pad, the terminal portion of the first signal trace extending toward and contacting the first pad and the terminal portion of the second signal trace extending away from the first pad and contacting a second pad. A projection of the run portion and branches of the second signal trace in a plane of the first layer substantially overlaps the run portion and branches of the first signal trace up to the portions where the branches of the traces come together again to form the terminal portions of the signal traces.

A fourth embodiment of the invention comprises a method. In the method first and second pads are formed in a printed circuit board. Then a first signal trace is formed in a first layer of the printed circuit board, the first signal trace comprising a run portion and an end portion. The end portion splits into two branches on a first lateral side of the first pad, one branch traversing a path around a top side of the first pad and one branch traversing a path around a bottom side of the first pad. The two branches come together again in a terminal portion on a second lateral side of the first pad, the terminal portion extending toward and contacting the first pad. Next, a second signal trace is formed in a second layer of the printed circuit board, the second signal trace comprising a run portion and an end portion. The end portion of the second signal trace splits into two branches on a first lateral side of the first pad, one branch traversing a path around a top side of the first pad and one branch traversing a path around a bottom side of the first pad. The two branches of the second signal trace come together again in a terminal portion on a second lateral side of the first pad, the terminal portion of the second signal trace extending away from the first pad and contacting a second pad. A projection of the run portion and branches of the second signal trace in a plane of the first layer substantially overlaps the run portion and branches of the first signal trace.

A fifth embodiment of the invention comprises a computer readable memory medium tangibly embodying a computer program. When the computer program is executed by a digital processing apparatus operations are performed. In one operation first and second pads are formed in a printed circuit board. Then in another operation, a first signal trace is formed in a first layer of the printed circuit board. The first signal trace comprises a run portion and an end portion. The end portion splits into two branches on a first lateral side of the first pad, one branch traversing a path around a top side of the first pad and one branch traversing a path around a bottom side of the first pad. The two branches come together again in a terminal portion on a second lateral side of the first pad, the terminal portion extending toward and contacting the first pad. In a further operation a second signal trace is formed in a second layer of the printed circuit board, the first signal trace comprising a run portion and an end portion. The end portion of the second signal trace splits into two branches on a first lateral side of the first pad, one branch traversing a path around a top side of the first pad and one branch traversing a path around a bottom side of the first pad. The two branches of the second signal trace come together again in a terminal portion on a second lateral side of the first pad, the terminal portion of the second signal trace extending away from the first pad and contacting a second pad. A projection of the run portion and branches of the second signal trace in a plane of the first layer substantially overlaps the run portion and branches of the first signal trace.

Although an order may be interpreted in the summary of the fourth and fifth embodiments, none is intended and one of ordinary skill in the art will understand that performing the steps or operations of the fourth and fifth embodiments in a different order will remain within the scope of the invention.

In conclusion, the foregoing summary of the embodiments of the present invention is exemplary and non-limiting. For example, one of ordinary skill in the art will understand that one or more aspects or steps from one embodiment can be combined with one or more aspects or steps from another embodiment to create a new embodiment within the scope of the present invention.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein.

DETAILED DESCRIPTION OF THE PREFERRED EMBODIMENTS

Figure 1:
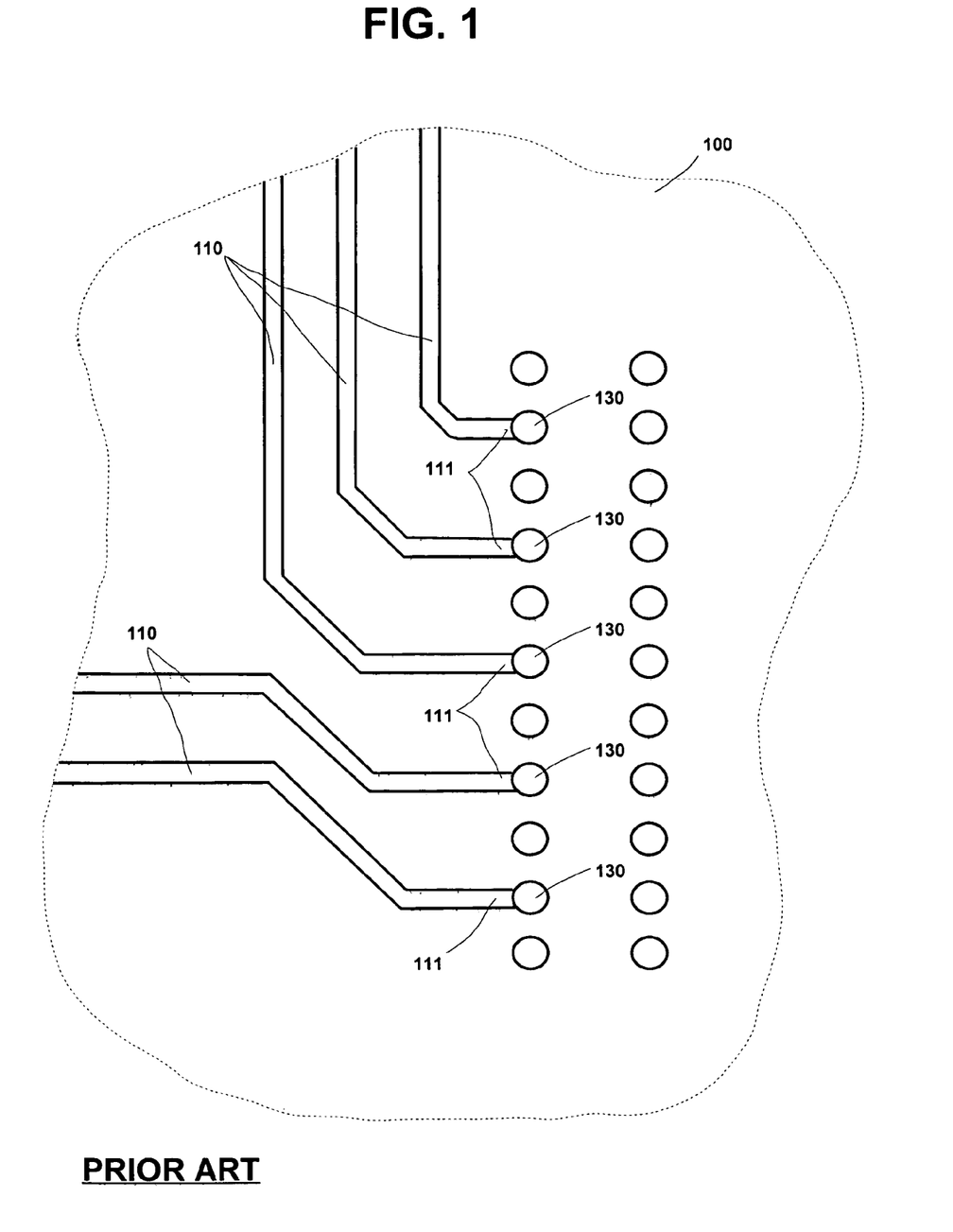
FIG. 1 depicts first halves of differential pairs configured in accordance with the prior art.
Figure 2:
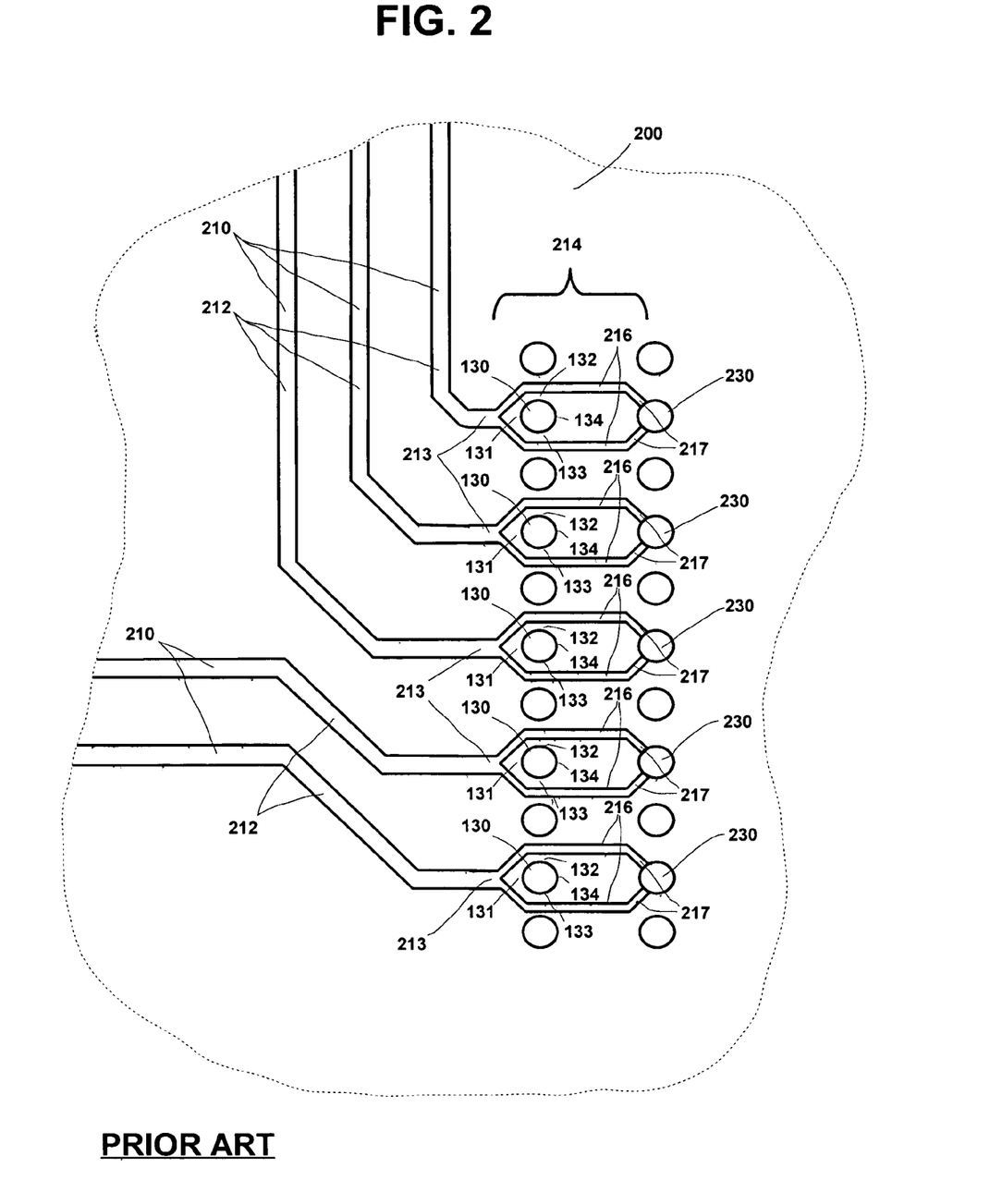
FIG. 2 depicts second halves of differential pairs configured in accordance with the prior art.
Figure 3:
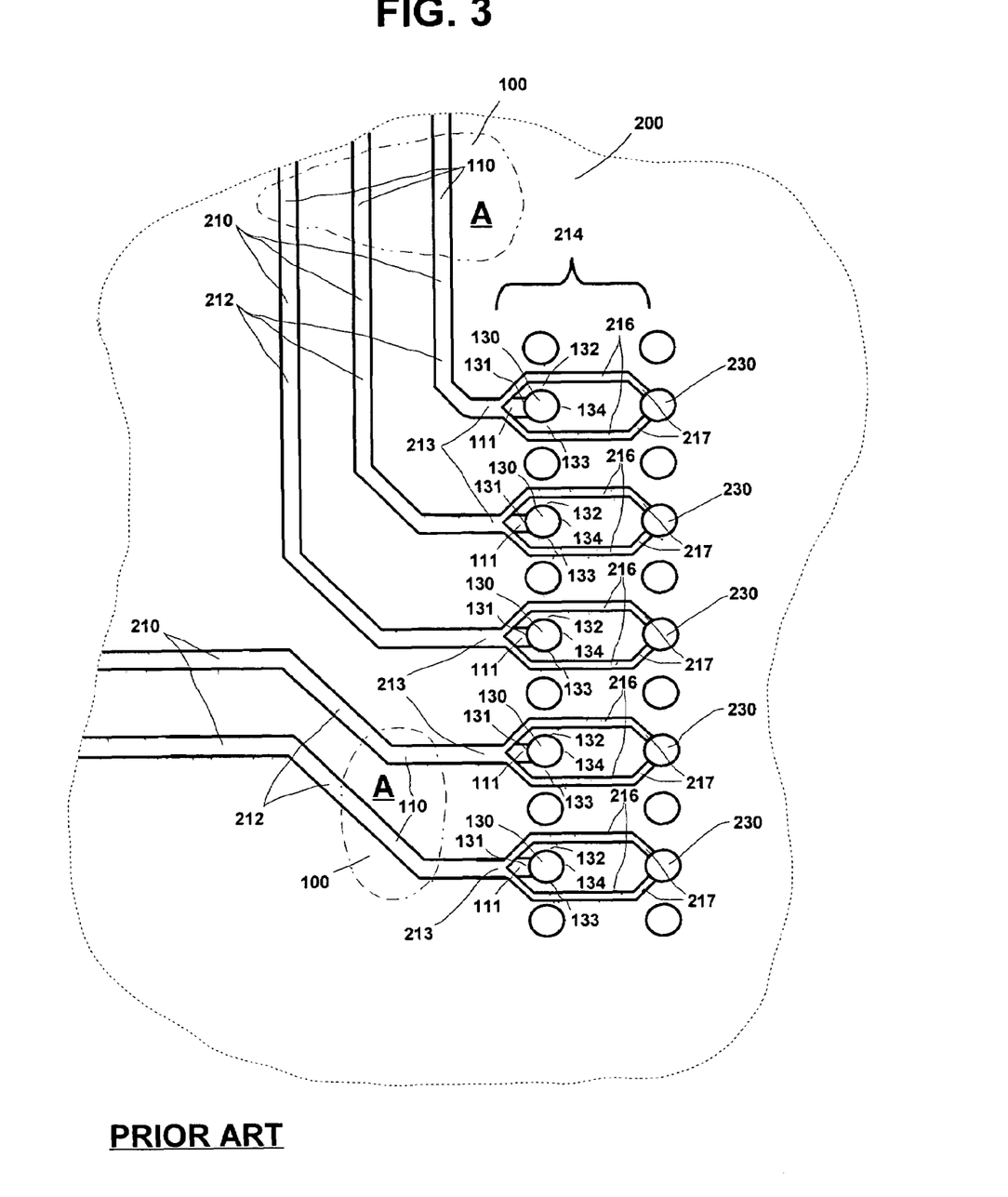
FIG. 3 depicts both halves of differential pairs configured in accordance with the prior art.

FIGS. 1-3 show a typical connection arrangement of differential pairs made in accordance with the prior art. FIG. 1 depicts a first layer 100 of a printed circuit board ("PCB") having a plurality of first signal traces 110 of a plurality of differential pairs. Each of the first signal traces has a terminal portion 111 where it connects to first pads 130. FIG. 2 depicts a second layer 200 of the printed circuit board. The second layer 200 is adjacent to the first layer 100, and may be formed either below, or on top of, first layer 100. In this particular instance, second layer 200 is formed on top of first layer 100. Second layer 200 has a plurality of second signal traces 210. First and second signal traces 110, 210 having the same overall shape (excluding the portion where they are connected to pads) as revealed by comparison of FIGS. 1 and 2 comprise a differential pair; FIGS. 1-3 depict a plurality of differential pairs. In contrast to the first signal traces 110 depicted in FIG. 1, the second signal traces depicted in FIG. 2 have distinct run portions 212 and end portions 214. In a region of the second layer 200 of the PCB on first lateral sides 131 of pads 130 the end portions 214 of the second signal traces 210 split into two branches 216. One branch 216 each from each of the second signal traces 210 traverses a path around top sides 132 of the first pads 130, and one branch 216 each from the second signal traces 210 traverses a path around bottom sides 133 of first pads 130. The branches 216 extend in a direction generally toward second pads 230, and diagonally turn towards the second pads 130 at their terminal ends 217 so that they contact the second pads.

FIG. 3 depicts a top view of first and second layers 100, 200 of the PCB after fabrication, where the first and second signal traces 110, 210 comprising differential pairs are shown. First signal traces 110 are evident in regions A which comprise partial cut-away views showing portions of first layer 100. As is evident, the run portions 212 of second signal traces 210 overlap the corresponding portions of first signal traces 110, except where the traces are connected to pads. Here, the terminal portions 111 of first signal traces 110 are apparent.

FIG. 3 depicts limitations of the prior art. In particular, the lengths of the first and second signal traces 110, 210 are different. In addition, the configuration of the end portions of the first and second signal traces 110, 210 where they are connected to pads 130, 230 is different. For example, first signal traces have a uniform width throughout and extend without branching up to their terminal ends 111 where they contact first pads 130. In contrast, at their end portions 214 second signal traces 210 split into two branches 216 having different widths than the terminal ends 111 of the first signal traces 110. Each of these differences results in an impedance mismatch between the first and second signal traces, thereby lessening the benefit of using a differential pair.

Figure 4:
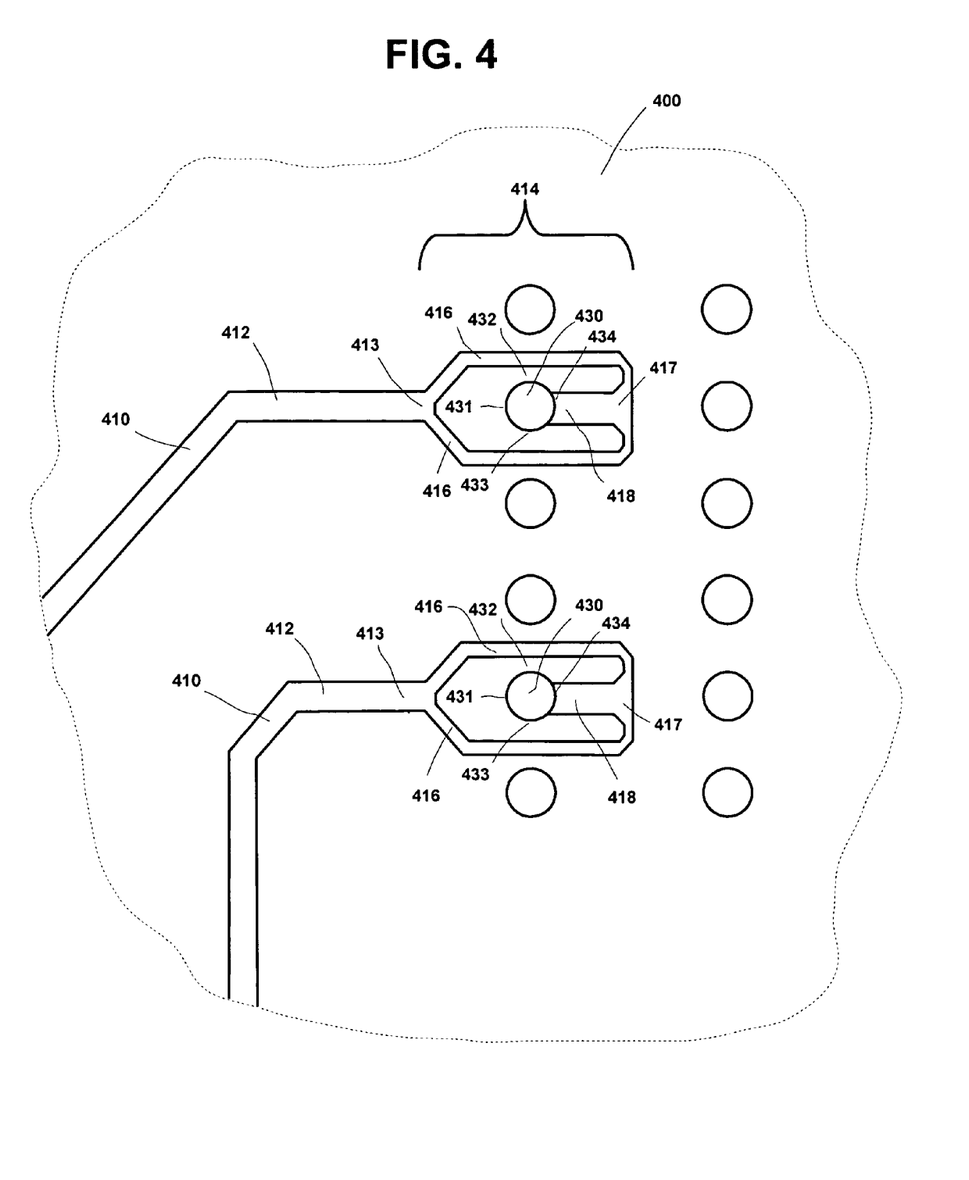
FIG. 4 depicts first halves of differential pairs configured in accordance with the invention.
Figure 5:
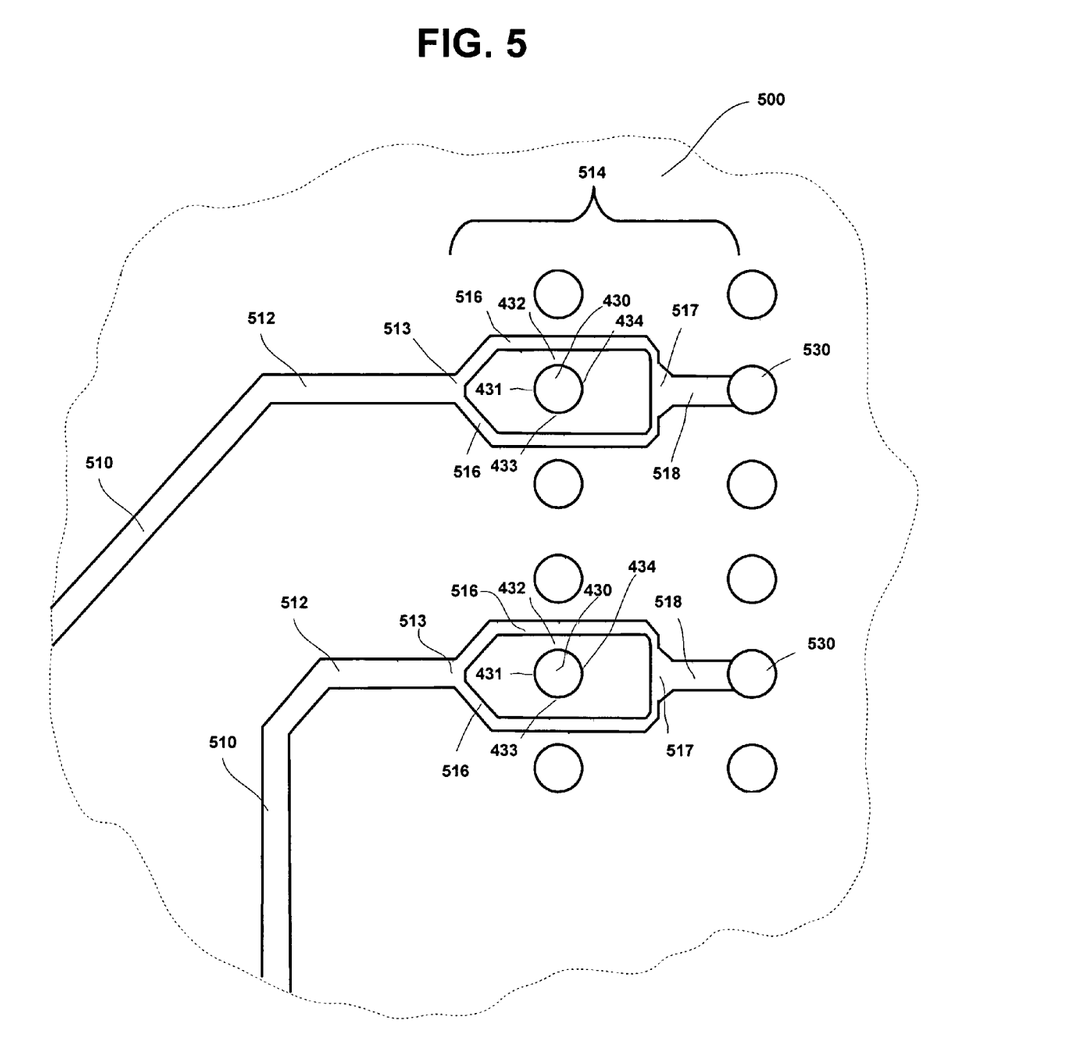
FIG. 5 depicts second halves of differential pairs configured in accordance with the invention.
Figure 6:
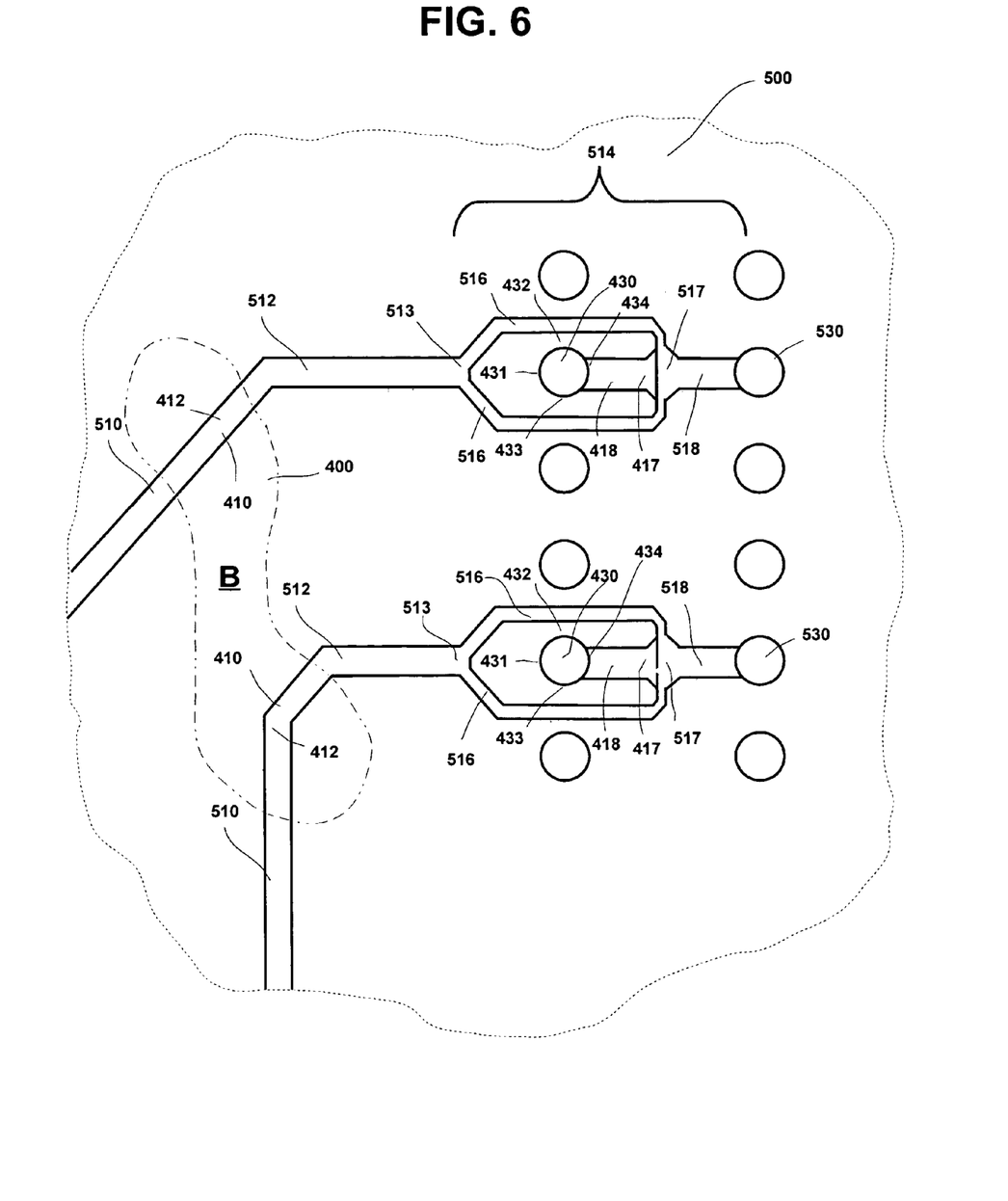
FIG. 6 is a partial cut-away view depicting both halves of differential pairs configured in accordance with the invention.

FIGS. 4-6 show a differential pair connection arrangement in accordance with an embodiment of the invention. Although described within the context of a printed circuit board, aspects of the invention can be practiced in other substrates found in, for example, integrated circuits. In a first layer 400 of a PCB shown in FIG. 4, first signal traces 410 extend in a direction away from ports (not shown) towards a plurality of first pads 430. As used herein, "pad" refers to any apparatus for making connections between circuit portions and includes, but is not limited to, solder pads, vias, through holes, etc. The first signal traces 410 comprise a run portion 412 and an end portion 414. In a region 413 on first lateral sides 431 of the first pads 430 the end portions 414 of the first signal traces 410 split into two branches. One branch 416 of each of the first signal traces 410 traverses a path around top sides 432 of first pads 430, and one branch of each of the first signal traces 410 traverses a path around bottom sides 433 of first pads 430. In regions 417 of the PCB on second lateral sides 434 of the first pads 430 the branches 416 come together again in terminal portions 418. The terminal portions 418 extend away from regions 417 towards first pads 430, and terminal portions 418 of the first signal traces 410 contact first pads 430.

The references to "first lateral side", "second lateral side", "top side" and "bottom side" are not intended to imply either an absolute orientation with reference to a point external to the PCB or a particular pad configuration (circular, square, etc). Rather, these references generally relate portions of individual pads to one another, and to traces. The references would be how one looking down on a PCB would observe the relationships if the PCB were oriented so that the end portions of the signal traces were immediately below the observer's eyes, with the run portions entering the observer's field of view from the left.

The second signal traces 510 comprising the second halves of the differential pairs are formed in a second layer 500 of the PCB as depicted in FIG. 5. The first and second layers 400, 500 are adjacent and can be layered in any particular order; as is apparent in FIG. 6, layer 500 is positioned atop layer 400. The first and second signal traces depicted in FIGS. 4 and 5 having the same configuration comprise differential pairs. Similar to the first signal traces 410 depicted in FIG. 5, second signal traces 510 have distinct run portions 512 and end portions 514. Also similar to first signal traces 410, second signal traces split into two separate branches in regions 513 on first lateral sides 431 of the first pads 430, traverse paths around top 432 and bottom sides 433 of first pads 430, and come together again in a region 517 on second lateral sides 434 of first pads 430, forming terminal portions 518. The terminal portions 518 extend away from regions 517 and first pads 430 towards second pads 530 and the terminal portions 518 of the second signal traces 510 contact second pads 530.

The branches 516 of the second signal traces 510 traversing paths around top and bottom sides 432, 433 of the first pads 430 encompasses both situations where the branches 516 are at the same vertical level as the first pads 430, and situations where the branches 516 are at a vertical level different from the first pads 430, but projections of the branches 516 in the first layer 400 can be said to follow the described paths around the first pads 430.

The first and second signal traces 410, 510 are formed from conductive material. In the embodiment depicted in FIGS. 4-6 the widths of the branches 416, 516 are w and the widths of the run portions 412, 512 are 2w. Different widths for the branches may be selected, where the widths of the branches, when added, equal the width of the run portions.

The fabricated PCB with two overlapping layers 400, 500 is depicted in FIG. 6. As is shown in the partial cut-away view apparent in region B, the run portions 512 of the second signal traces 510 overlap the run portions 412 of the first signal traces 410. Although not apparent in FIG. 6, the end portions 514 of second signal traces 510 overlap the end portions 414 of first signal traces 410 up to the regions 417, 517 where the branches 416, 516 of the first and second signal traces 410, 510 come together again. The terminal portions 418, 518 of first and second signal traces 410, 510 extend in directions away from each other towards first and second pads 430, 530, respectively. The terminal portions 418, 518 are selected to be substantially the same length in applications where the best impedance match is desired. In other applications where other criteria are important, such as layout geometry, the improvement in impedance matching achieved by the overlapping of the branch portions may be deemed sufficient and the terminal portions may differ somewhat in length.

In FIG. 6 differential pairs are not shown connecting to each pad pair. In instances where adjacent pad pairs are so close so that a differential pair connection arrangement in accordance with the invention could not be used to connect all pad pairs using only two PCB layers, then additional PCB layers could be used. For example, two additional PCB layers could be implemented. A first pad pair would have differential connections made in first and second layers of the PCB, and a second pad pair adjacent to the first pad pair would have differential connections made in third and fourth layers.

Advantages of the invention are immediately apparent when comparing FIG. 3 and FIG. 6. In particular, with proper spacing of first and second pads 430, 530, the first and second signal traces 410, 510 comprising the differential pairs of the invention have substantially the same length, unlike the first and second signal traces 110, 120 depicted in FIGS. 1-3 which are purposely designed to have different lengths. In addition the general configuration and dimensions of branches 416, 516 of the first and second signal traces 410, 510 of the invention are the same in contrast to the first and second signal traces 110, 120 depicted in FIGS. 1-3, where the first signal traces do not even branch. Accordingly, arrangements in accordance with the present invention achieve improved impedance matching between signal traces comprising differential pairs when compared with arrangements in accordance with the prior art.

The differential pair connection arrangement of the present invention is particularly beneficial in situations where differential clock and high speed signals are being routed. High speed signals are a major source of noise in circuits, acting as aggressors, and improvements in noise resistance are provided by the connection arrangement of the invention in comparison to arrangements in accordance with the prior art. The invention will provide relatively weak and analog signals with improved resistance to such aggressors.

In the embodiment of the invention depicted in FIGS. 4-6 the first and second signal traces are shown as single-ended, but of course the signal traces are connected at both ends. Aspects of embodiments of the invention evident in the end portions 414, 514 can be practiced at both ends of run portions of first and second signal traces comprising a differential pair. In such an embodiment, the end portions 414, 514 evident in FIGS. 4-6 would comprise first end portions positioned at proximal ends of the run portions 412, 512 of the first and second signal traces 410, 510. Second end portions would be formed at distal ends (not shown) of the run portions 412, 512 of the first and second signal traces and would have the same end portion structure as depicted in FIGS. 4-6 except that the second end portions of the first signal traces 410 would be connected to third pads, and the second end portions of the second signal traces would be connected to fourth pads. The second end portions of the first and second signal traces split into two branches on a first lateral side of the third pad in the same manner of the branches 416, 516 as depicted in FIGS. 4-6. One branch of each of the second end portions of the first and second signal traces would traverse a path around a top side of the third pad, and one branch of each of the first and second signal traces would traverse a path around a bottom side of the third pad. The branches of the second end portions of the first and second signal traces would come together again in terminal portions on a second lateral side of the third pad. The terminal portion of the second end portion of the first signal trace would extend in a direction toward and contact the third pad. The terminal portion of the second end portion of the second signal trace would extend in a direction away from the third pad and contact the fourth pad.

Figure 7:
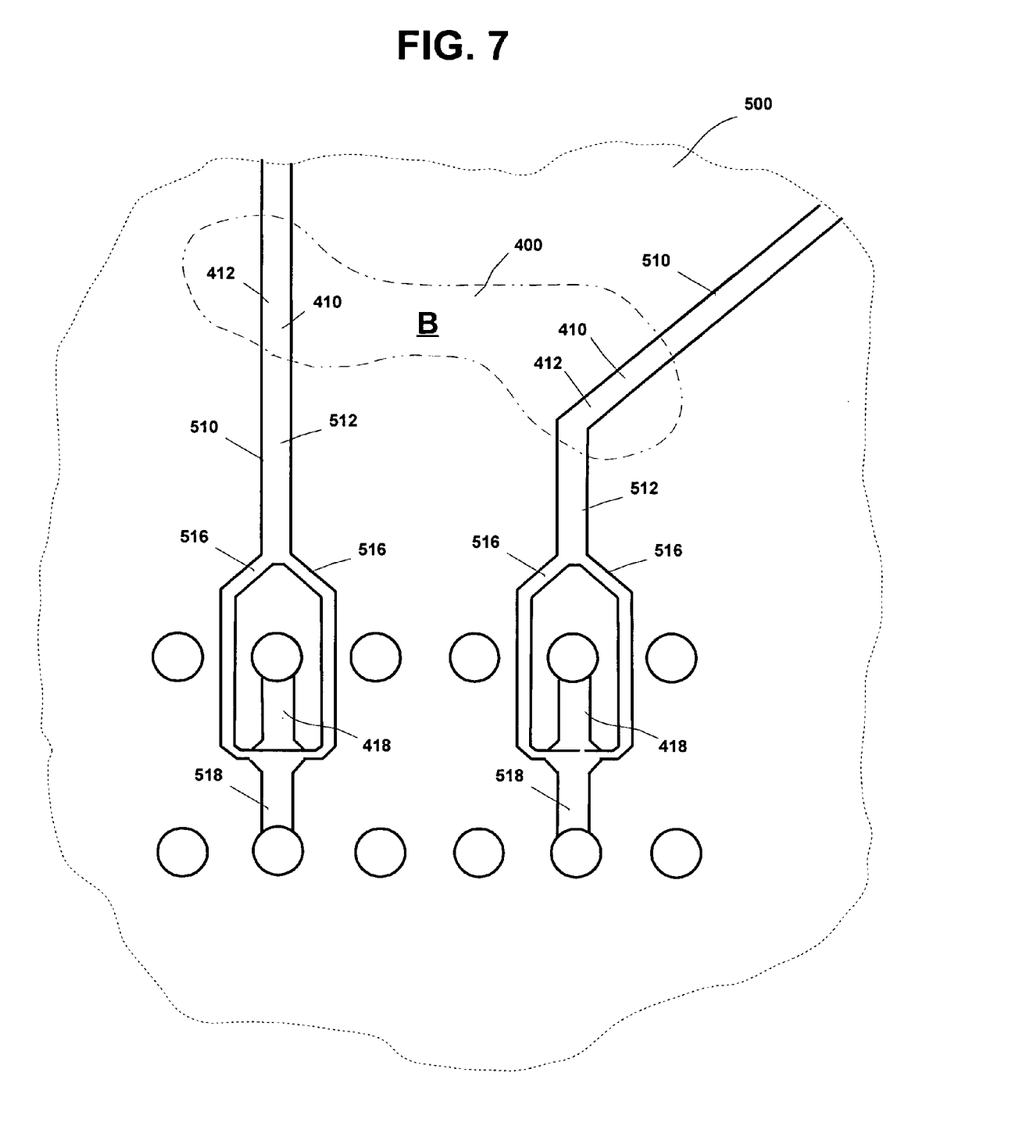
FIG. 7 is a partial cut-away view depicting both halves of differential pairs configured in accordance with the invention where the differential pairs form connections with pairs of pads arrayed in columns.
Figure 8:
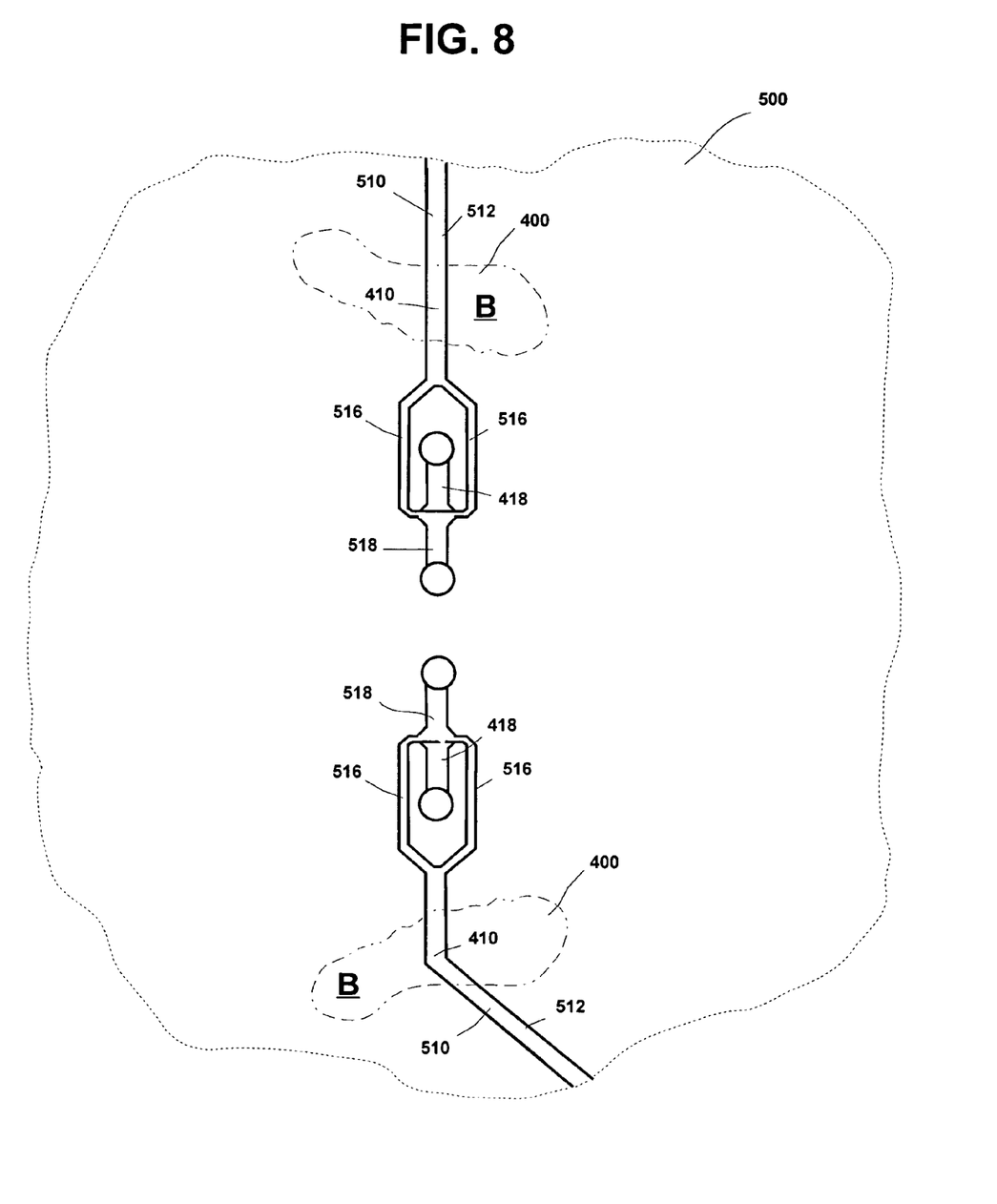
FIG. 8 is a partial cut-away view depicting both halves of differential pairs configured in accordance with the invention where the differential pairs form connections with pairs of pads arrayed in a single column.

The differential pair connection arrangement of the invention can be used to make connections with pads arrayed differently than those depicted in FIGS. 4-6. For example, FIG. 7 is a partial cut-away view showing both halves of differential pairs making connections with pairs of pads arrayed in columns. FIG. 8 is a partial cut-away view showing both halves of differential pairs making connections with pairs of pads arrayed in a single column.

The differential pair connection arrangement of the invention can be applied to connection situations arising in many different fields. For example, the differential pair connection arrangement of the invention can be used to route differential signals in the following environments: 10 GbE (10 Gigabit Ethernet operating according to the IEEE 802.3 standard); PCI-Express; Serial ATA and SAS (Serial Attached SCSI); T1 (a North American standard for data communication across phone lines); E1 (a European standard similar to T1); Front Side Bus to Fully Buffered DIMM connections; USB (Universal Serial Bus); SerDes (integrated circuits that convert parallel data to serial data and vice versa); and for breakout from Ball Grid Array, Pin Grid Array and other high density connection arrangements.

Figure 9:
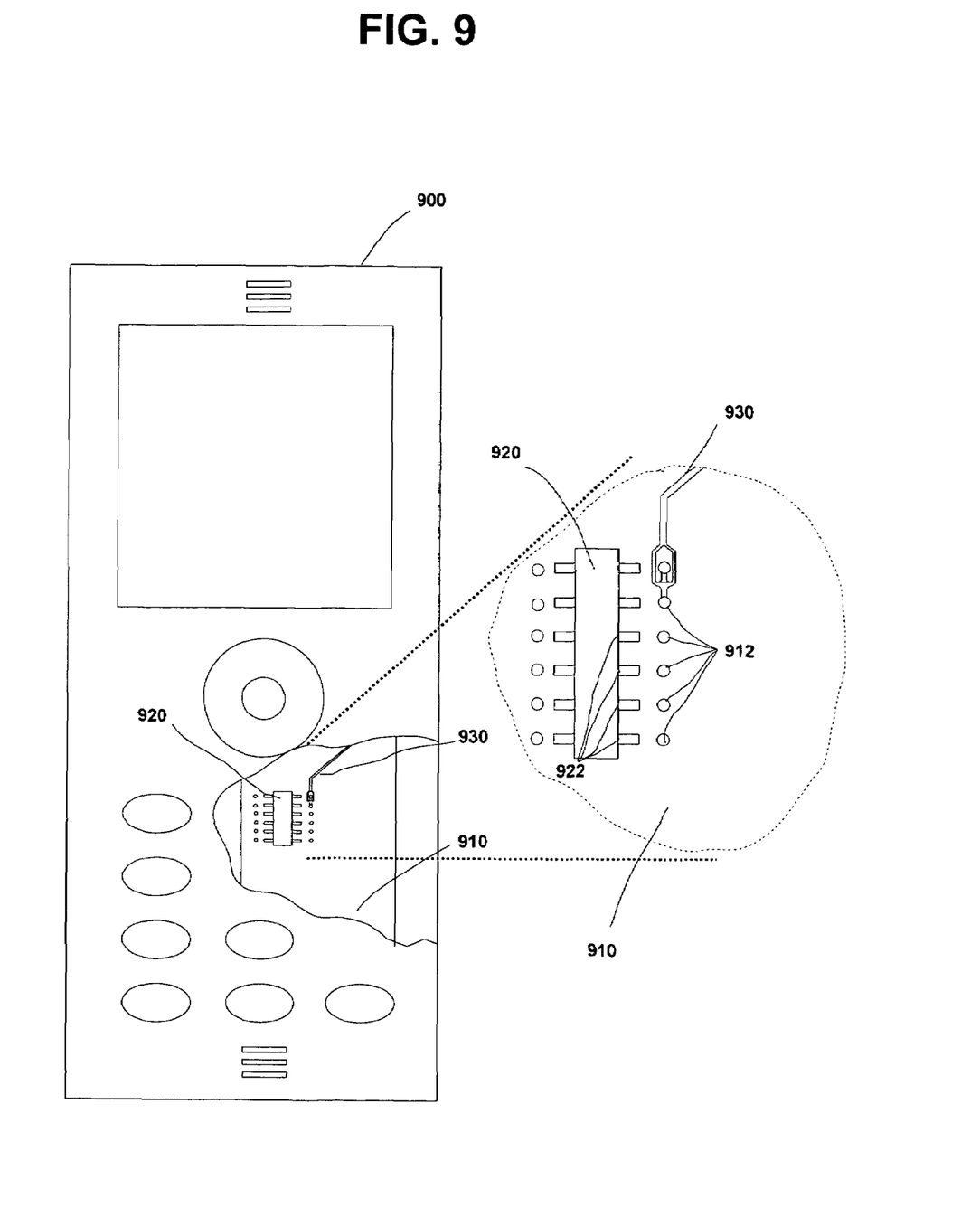
FIG. 9 is a partial cut-away view of an electronic device made in accordance with the invention.

An electronic device 900 made in accordance with the present invention is depicted in FIG. 9. In the cut-away portion of the electronic device 900 a printed circuit board 910 is apparent. An integrated circuit mounted in a dual-in line package 920 is bonded to printed circuit board 910. Contacts 922 of the integrated circuit are connected to the corresponding through holes 912 on the underside of the printed circuit board 910. Two of the through holes are connected to a differential pair 930 made in accordance with the invention.

Figure 10:
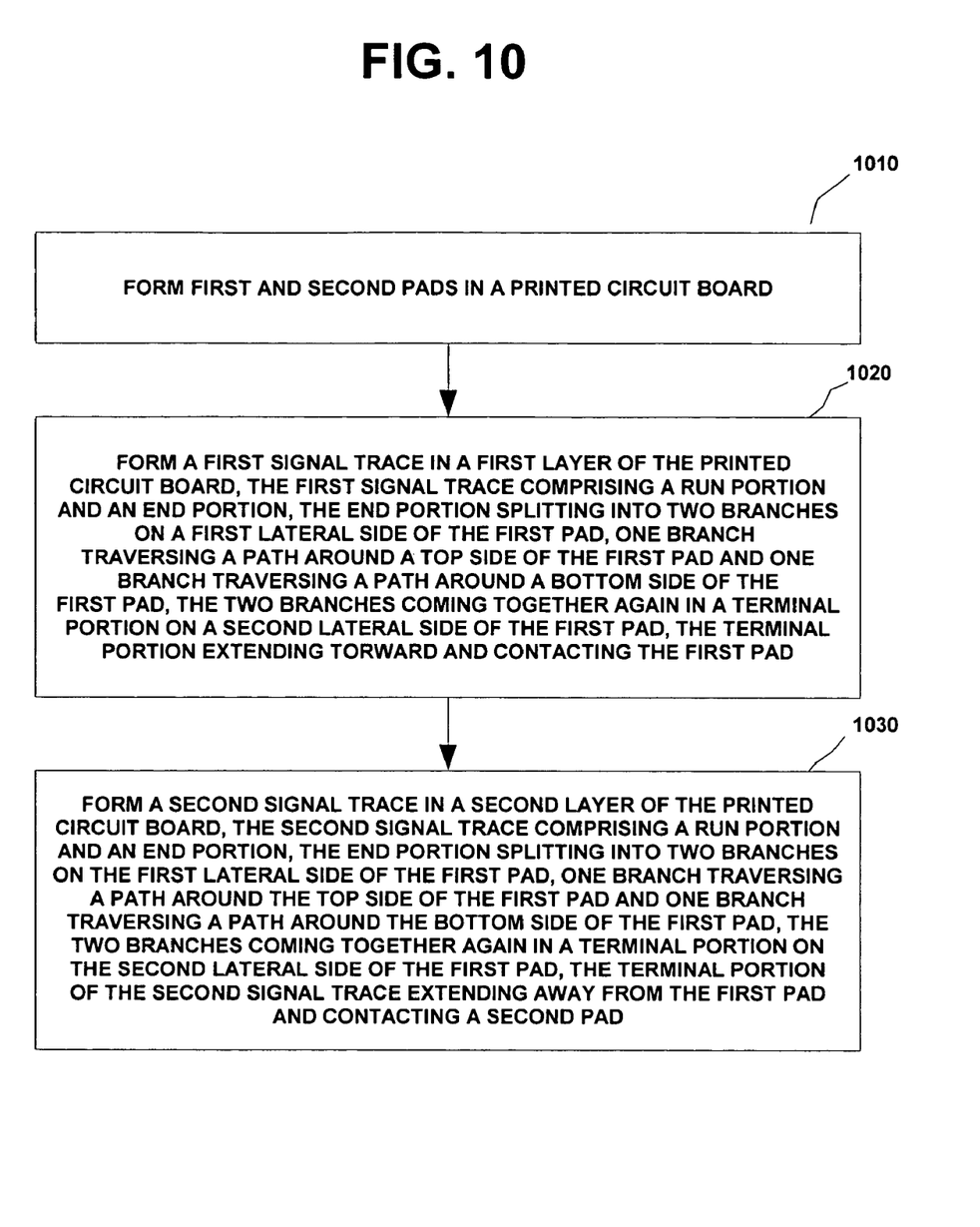
FIG. 10 depicts a method operating in accordance with the invention.

A method in accordance with the invention is depicted in the flow chart of FIG. 10. At 1010, first and second pads are formed in a printed circuit board. Then, at 1020 a first signal trace is formed in a first layer of the printed circuit board, the first signal trace comprising a run portion and an end portion. The end portion splits into a two branches on a first lateral side of the first pad, one branch traversing a path around a top side of the first pad and one branch traversing a path around a bottom side of the first pad. The two branches come together again in a terminal portion on a second lateral side of the first pad, the terminal portion extending toward and contacting the first pad. Next, at 1030, a second signal trace is formed in a second layer of the printed circuit board, the second signal trace comprising a run portion and an end portion. The end portion of the second signal trace splits into two branches on the first lateral side of the first pad, one branch traversing a path around a top side of the first pad and one branch traversing a path around a bottom side of the first pad. The two branches of the second signal trace come together again in a terminal portion on a second lateral side of the first pad, the terminal portion of the second signal trace extending away from and contacting the second pad.

The methods depicted and described herein can be tangibly embodied as a computer program in a computer-readable memory medium. Such computer-readable memory media comprise an aspect of the invention. Instructions of the computer program perform operations in accordance with the methods of the invention when executed by digital processing apparatus. Tangible computer-readable memory media include, but are not limited to, hard drives, CD- or DVD ROM, flash memory storage devices or RAM memory of a computer system.

Thus it is seen that the foregoing description has provided by way of exemplary and non-limiting examples a full and informative description of the best methods and apparatus presently contemplated by the inventors for implementing an improved differential pair connection arrangement. One skilled in the art will appreciate that the various embodiments described herein can be practiced individually; in combination with one or more other embodiments described herein; or in combination with differential pairs differing from those described herein. Further, one skilled in the art will appreciate that the present invention can be practiced by other than the described embodiments; that these described embodiments are presented for the purposes of illustration and not of limitation; and that the present invention is therefore limited only by the claims which follow.

I claim:

1. A differential pair connection arrangement comprising: first and second signal traces formed in first and second layers of a substrate, respectively, the first and second signal traces each comprising run portions and end portions, the end portions of the first and second signal traces each splitting into two branches on a first lateral side of a first pad, a branch of each signal trace traversing a path around a top side of the first pad and a branch of each signal trace traversing a path around a bottom side of the first pad, the branches of the first and second signal traces coming together again in terminal portions on a second lateral side of the first pad, the terminal portion of the first signal trace extending toward and contacting the first pad and the terminal portion of the second signal trace extending away from the first pad and contacting a second pad, and wherein a projection of the run portion and branches of the second signal trace in a plane of the first layer substantially overlaps the run portion and branches of the first signal trace up to the portions where the branches of the traces come together again to form the terminal portions of the signal traces.

2. The differential pair connection arrangement of claim 1, where a width of the branches of the first and second signal traces is w, and the width of the run portions of the first and second signal traces is 2w.

3. The differential pair connection arrangement of claim 1 where the terminal portions of the first and second traces are substantially the same length.

4. The differential pair connection arrangement of claim 1 where the end portions of the first and second signal traces comprise first end portions positioned at proximal ends of the run portions of the first and second signal traces, the first and second signal traces further comprising second end portions positioned at distal ends of the run portions of the first and second signal traces, the second end portions of the first and second signal traces splitting into two branches on a first lateral side of a third pad, a branch of each signal trace traversing a path around a top side of the third pad and a branch of each signal trace traversing a path around a bottom side of the third pad, the branches of the second end portions coming together again in terminal portions on a second lateral side of the third pad, the terminal portion of the second end portion of the first signal trace extending toward and contacting the third pad, and the terminal portion of the second end portion of the second signal trace extending in a direction away from the third pad and contacting a fourth pad, wherein a projection of the branches of the second end portion of the second signal trace in a plane of the first layer overlap the branches of the second end portion of the first signal trace.

5. The differential pair connection arrangement of claim 1 where the substrate comprises a printed circuit board.

6. The differential pair connection arrangement of claim 1 where the substrate comprises an integrated circuit.

7. The differential pair connection arrangement of claim 1 where the first and second signal traces comprise conductive material.

8. The differential pair connection arrangement of claim 1 where the first and second signal traces carry a 10 GbE differential signal.

9. The differential pair connection arrangement of claim 1 where the first and second signal traces are used to make interconnections in a PCI Express bus circuit.

10. The differential pair connection arrangement of claim 1 where the first and second signal traces are used to make interconnections in a Serial ATA bus circuit.

11. The differential pair connection arrangement of claim 1 where the first and second signal traces are used to make interconnections in a Serial Attached SCSI bus circuit.

12. The differential pair connection arrangement of claim 1 where the first and second signal traces carry a T1 differential signal.

13. The differential pair connection arrangement of claim 1 where the first and second signal traces carry an E1 differential signal.

14. The differential pair connection arrangement of claim 1 where the first and second signal traces are used to make interconnections between a front side bus and a fully buffered DIMM.

15. The differential pair connection arrangement of claim 1 where the first and second signal traces are used to make interconnections in a USB circuit.

16. The differential pair connection arrangement of claim 1 where the first and second signal traces are used to make interconnections in a circuit comprising at least one SerDes integrated circuit.

17. The differential pair connection arrangement of claim 1 where the first and second signal traces are used to make interconnections with at least one integrated circuit implemented in a ball grid array package.

18. The differential pair connection arrangement of claim 1 where the first and second signal traces are used to make interconnections with at least one integrated circuit implemented in a pin grid array package.

19. A printed circuit board comprising:
at least one integrated circuit, the integrated circuit having first and second ports, the first and second ports of the integrated circuit connected to first and second pads, respectively, of the printed circuit board;
a differential pair connection arrangement coupled to the first and second pads, the differential pair connection arrangement comprising:
a first signal trace formed in a first layer of the printed circuit board, the first signal trace comprising a run portion and an end portion, the end portion splitting into two branches on a first lateral side of the first pad in the first layer, the two branches traversing paths around top and bottom sides of the first pad, and coming together again in a terminal portion on a second lateral side of the first pad, the terminal portion contacting the first pad;
a second signal trace formed in a second layer of the printed circuit board, the second signal trace comprising a run portion and an end portion, the end portion splitting into two branches on the first lateral side of the first pad, the two branches of the second trace traversing paths around the top and bottom sides of the first pad, and coming together again in a terminal portion on the second lateral side of the first pad, the terminal portion of the second trace extending in a direction away from the first pad and contacting the second pad;
wherein a projection of the run portion and branches of the second signal trace in a plane of the first layer substantially overlaps the run portion and branches of the first signal trace.

20. The printed circuit board of claim 19 where a width of each of the branches of the first and second signal traces is w and a width of each of the run portions of the first and second signal traces is 2w.

21. The printed circuit board of claim 19 where the end portions of the first and second signal traces comprise first end portions positioned at proximal ends of the run portions of the first and second signal traces, the first and second signal traces further comprising second end portions positioned at distal ends of the run portions of the first and second signal traces, the second end portions of the first and second signal traces splitting into two branches on a first lateral side of a third pad, a branch of each signal trace traversing a path around a top side of the third pad and a branch of each signal trace traversing a path around a bottom side of the third pad, the branches of the second end portions coming together again in terminal portions on a second lateral side of the third pad, the terminal portion of the second end portion of the first signal trace extending toward and contacting the third pad, and the terminal portion of the second end portion of the second signal trace extending in a direction away from the third pad and contacting a fourth pad, wherein a projection of the branches of the second end portion of the second signal trace in a plane of the first layer overlap the branches of the second end portion of the first signal trace.

22. The differential pair connection arrangement of claim 19 where the first and second signal traces comprise conductive material.

23. An electronic device comprising:
at least one printed circuit board, the printed circuit board comprising:
at least one integrated circuit, the integrated circuit having first and second ports, the first and second ports of the integrated circuit connected to first and second pads, respectively, of the printed circuit board;
a differential pair connection arrangement coupled to the first and second pads, the differential pair connection arrangement comprising:
first and second signal traces formed in first and second layers of the printed circuit board, respectively, the first and second signal traces each comprising run portions and end portions, the end portions of the first and second signal traces each splitting into two branches on a first lateral side of the first pad, a branch of each signal trace traversing a path around a top side of the first pad and a branch of each signal trace traversing a path around a bottom side of the first pad, the branches of the first and second signal traces coming together again in terminal portions on a second lateral side of the first pad, the terminal portion of the first signal trace extending toward and contacting the first pad and the terminal portion of the second signal trace extending away from the first pad and contacting a second pad, and wherein a projection of the run portion and branches of the second signal trace in a plane of the first layer substantially overlaps the run portion and branches of the first signal trace up to the portions where the branches of the traces come together again to form the terminal portions of the traces.

24. The electronic device of claim 23, where a width of each of the branches of the first and second signal traces is w and a width of each of the run portions of the first and second signal traces is 2w.

25. The electronic device of claim 23 where the end portions of the first and second signal traces comprise first end portions positioned at proximal ends of the run portions of the first and second signal traces, the first and second signal traces further comprising second end portions positioned at distal ends of the run portions of the first and second signal traces, the second end portions of the first and second signal traces splitting into two branches on a first lateral side of a third pad, a branch of each signal trace traversing a path around a top side of the third pad and a branch of each signal trace traversing a path around a bottom side of the third pad, the branches of the second end portions coming together again in terminal portions on a second lateral side of the third pad, the terminal portion of the second end portion of the first signal trace extending in a direction toward and contacting the third pad, the terminal portion of the second end portion of the second signal trace extending in a direction away from the third pad and contacting a fourth pad, wherein a projection of the branches of the second end portion of the second signal trace in a plane of the first layer substantially overlap the branches of the second end portion of the first signal trace.

26. The method of claim 23 where the first and second signal traces comprise conductive material.

27. A method comprising:

forming first and second pads in a printed circuit board;

forming a first signal trace in a first layer of the printed circuit board, the first signal trace comprising a run portion and an end portion, the end portion splitting into two branches on a first lateral side of the first pad, one branch traversing a path around a top side of the first pad and one branch traversing a path around a bottom side of the first pad, the two branches coming together again in a terminal portion on a second lateral side of the first pad, the terminal portion extending toward and contacting the first pad;

forming a second signal trace in a second layer of the printed circuit board, the first signal trace comprising a run portion and an end portion, the end portion of the second signal trace splitting into two branches on a first lateral side of the first pad, one branch traversing a path around a top side of the first pad and one branch traversing a path around a bottom side of the first pad, the two branches coming together again in a terminal portion on a second lateral side of the first pad, the terminal portion of the second signal trace extending away from the first pad and contacting a second pad; and wherein a projection of the run portion and branches of the second signal trace in a plane of the first layer substantially overlaps the run portion and branches of the first signal trace.

28. The method of claim 27 where a width of each of the branches of the first and second signal traces is w and a width of the run portions of each of the first and second signal traces is 2w.

29. The method of claim 27 where the forming first and second pads further comprises forming third and fourth pads, and where end portions of the first and second signal traces comprise first end portions located at proximal ends of the run portions of the first and second signal traces, the first and second signal traces further comprising second end portions located at a distal ends of the run portions of the first and second signal traces, the second end portions of the first and second signal traces splitting into two branches on a first lateral side of the third pad, a branch of each signal trace traversing a path around a top side of the third pad and a branch of each signal trace traversing a path around a bottom side of the third pad, the branches of the second end portions coming together again in terminal portions on a second lateral side of the third pad, the terminal portion of the second end portion of the first signal trace extending in a direction toward and contacting the third pad, and the terminal portion of the second end portion of the second signal trace extending in a direction away from the third pad and contacting a fourth pad, wherein a projection of the branches of the second end portion of the second signal trace in a plane of the first layer overlaps the branches of the second end portion of the first signal trace.

30. The method of claim 27 where the first and second signal traces comprise conductive material.

31. A computer readable memory medium tangibly embodying a computer program, wherein when the computer program is executed by a digital processing apparatus operations are performed, the operations comprising:

forming a first and second pads in a printed circuit board;

forming a first signal trace in a first layer of the printed circuit board, the first signal trace comprising a run portion and an end portion, the end portion splitting into two branches on a first lateral side of the first pad, one branch traversing a path around a top side of the first pad and one branch traversing a path around a bottom side of the first pad, the two branches coming together again in a terminal portion on a second lateral side of the first pad, the terminal portion extending toward and contacting the first pad;

forming a second signal trace in a second layer of the printed circuit board, the first signal trace comprising a run portion and an end portion, the end portion of the second signal trace splitting into two branches on a first lateral side of the first pad, one branch traversing a path around a top side of the first pad and one branch traversing a path around a bottom side of the first pad, the two branches coming together again in a terminal portion on a second lateral side of the first pad, the terminal portion of the second signal trace extending away from the first pad and contacting a second pad; and wherein a projection of the run portion and branches of the second signal trace in a plane of the first layer substantially overlaps the run portion and branches of the first signal trace.

* * * * *